(12) United States Patent
van der Straten et al.

(10) Patent No.: US 12,002,498 B2
(45) Date of Patent: Jun. 4, 2024

(54) COAXIAL TOP MRAM ELECTRODE

(71) Applicant: INTERNATIONAL BUSINESS MACHINES CORPORATION, Armonk, NY (US)

(72) Inventors: Oscar van der Straten, Guilderland Center, NY (US); Koichi Motoyama, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 17/806,790

(22) Filed: Jun. 14, 2022

(65) Prior Publication Data

US 2023/0402079 A1    Dec. 14, 2023

(51) Int. Cl.
| | | |
|---|---|---|
| *G11C 11/15* | (2006.01) | |
| *G11C 11/16* | (2006.01) | |
| *H10B 61/00* | (2023.01) | |
| *H10N 50/01* | (2023.01) | |
| *H10N 50/10* | (2023.01) | |
| *H10N 50/80* | (2023.01) | |

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02)

(58) Field of Classification Search
CPC ..... G11C 11/16; G11C 11/161; G11C 11/165; G11C 11/1653; G11C 11/1655; G11C 11/1657; G11C 11/1659; G11C 11/1673; G11C 11/1675; G11C 11/1677; G11C 11/1693; G11C 11/1695; G11C 11/1697; G11C 11/14; G11C 11/15; G11C 11/155
See application file for complete search history.

(56) References Cited

U.S. PATENT DOCUMENTS

| | | | |
|---|---|---|---|
| 8,455,965 B2 | 6/2013 | Li | |
| 8,644,063 B2 | 2/2014 | Li | |
| 9,070,869 B2 | 6/2015 | Jung | |
| 11,114,606 B2 | 9/2021 | Reznicek | |
| 2015/0056722 A1 | 2/2015 | Li | |
| 2020/0098978 A1 | 3/2020 | Liao | |
| 2021/0098530 A1* | 4/2021 | Manfrini | ............... H10N 50/10 |
| 2021/0118949 A1 | 4/2021 | Worledge | |
| 2021/0375986 A1 | 12/2021 | Dutta | |
| 2021/0391534 A1 | 12/2021 | Wu | |

* cited by examiner

*Primary Examiner* — Alfredo Bermudez Lozada
(74) *Attorney, Agent, or Firm* — Gavin Giraud

(57) ABSTRACT

Embodiments of the invention include a semiconductor structure with a first magneto-resistive random access memory (MRAM) pillar with a bottom electrode layer, a reference layer connected above the bottom electrode layer, a free layer, and a tunnel barrier between the reference layer and the free layer. The MRAM pillar includes a pillar diameter. The semiconductor structure also includes a coaxial top electrode with a top diameter that is less than the pillar diameter.

20 Claims, 6 Drawing Sheets

COAXIAL TOP MRAM ELECTRODE

BACKGROUND

The present invention relates generally to the field of magneto-resistive random access memory (MRAM), and more particularly to reducing shorts caused by voids in an interlayer dielectric (ILD) between MRAM pillars by reducing the diameter of a top electrode.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates (each of which can hold a magnetization) separated by a thin insulating layer. One of the two plates is a permanent magnet set to a particular polarity. The magnetization of the other plate can be changed to match that of an external field to store memory.

MRAM circuits may be fabricated as pillars of cells, with each cell having the two plates and the insulating layer and being insulated from the rest of the cells. Cell density is a high determinant for performance and cost in a memory system. Smaller, fewer, or more tightly packed MRAM cells mean that more memory storage can be produced and utilized in a single chip, and devices that use the chip will have more storage capacity.

SUMMARY

Embodiments of the invention include a semiconductor structure with a first magneto-resistive random access memory (MRAM) pillar with a bottom electrode layer, a reference layer connected above the bottom electrode layer, a free layer, and a tunnel barrier between the reference layer and the free layer. The MRAM pillar includes a pillar diameter. The semiconductor structure also includes a coaxial top electrode with a top diameter that is less than the pillar diameter.

Embodiments of the invention also include a method of fabricating a magneto-resistive random access memory (MRAM) device. The method includes forming a bottom electrode layer, a reference layer connected above the bottom electrode layer, a free layer, and a tunnel barrier between the reference layer and the free layer and forming a first coaxial top electrode surrounded by a first conformal dielectric. The coaxial top electrode includes a top diameter and the conformal dielectric comprises a pillar diameter. The method may also include etching the bottom electrode layer, the reference layer, the free layer, and the tunnel barrier to form an MRAM pillar, wherein the first conformal dielectric masks the bottom electrode layer, the reference layer, the free layer, and the tunnel barrier, removing the conformal dielectric, and forming an inter-level dielectric (ILD) around the MRAM pillar and the top electrode.

Embodiments of the invention also include a semiconductor structure. The semiconductor structure may include a first magneto-resistive random access memory (MRAM) pillar with a first body comprising a first pillar diameter, and a first coaxial top electrode with a first top diameter that is smaller than the first pillar diameter. The semiconductor structure may also include a second MRAM pillar adjacent to the first MRAM pillar. The second MRAM pillar may have a second body that having a second pillar diameter, and a second coaxial top electrode having a second top diameter that is smaller than the second pillar diameter, and an inter-level dielectric (ILD) between the first MRAM pillar and the second MRAM pillar.

DETAILED DESCRIPTION

Figure 1:
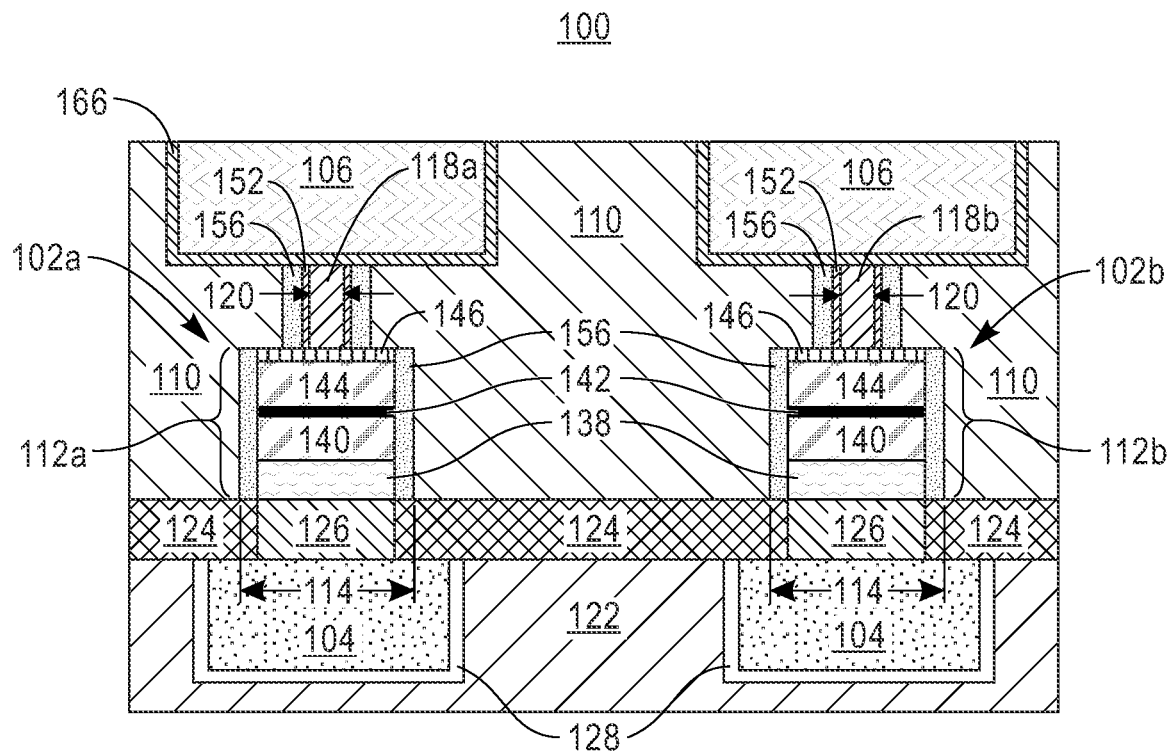
FIG. 1 depicts a cross-sectional side view of a semiconductor structure, in accordance with an embodiment of the invention.

Embodiments of the present invention recognize that certain inter-level dielectric (ILD) materials have been developed for deposition primarily on flat/featureless surfaces. In fabricating magneto-resistive random access memory (MRAM) devices, however, MRAM cells may be formed as pillars above the flat/featureless surfaces. The pillars may be formed before the deposition of the ILD, rather than through the use of damascene or dual damascene techniques. In the subsequent ILD deposition on the pillars, voids can develop between the pillars, and can lead to shorts. The voids result from dielectric deposition growing together to form a barrier between the tops of adjacent MRAM pillars. This barrier blocks additional ILD from filling in the area between the MRAM pillars (i.e., below the barrier), which results in a void that cannot be filled with additional ILD. At a later stage in fabrication, the ILD may be planarized to form the next metal level, which exposes the void. The exposed void may then get filled with unwanted metal during the formation of the next metal level. This unwanted metal can enable electric signals to short from one MRAM pillar to the adjacent MRAM pillar.

Therefore, embodiments disclosed herein are formed with a coaxial top electrode for the MRAM pillars, which increases a distance between adjacent MRAM pillars at a top portion. The increased distance reduces the likelihood of ILD forming a barrier between the tops of the MRAM pillars before the space between the pillars is filled with ILD. Since the ILD does not grow together, the space between the pillars does not form voids, and then does not result in shorts between the MRAM pillars.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on," "over," or "above" another element, it can be directly on the other element or intervening elements may also be present. In contrast, when an element is referred to as being "directly on" or "directly over" another element, there are no intervening elements present. It will also be understood that when an element is referred to as being "beneath," "under," or "below" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, MRAM pillar 102 may refer to a single MRAM pillar 102 or multiple MRAM pillars 102.

The present invention will now be described in detail with reference to the Figures.

FIG. 1 depicts a cross-sectional side view of a simplified structure of a semiconductor structure 100, in accordance with one embodiment of the present invention. As depicted, the semiconductor structure 100 has a first magneto-resistive random access memory (MRAM) pillar 102a and a second MRAM pillar 102b. The MRAM pillars 102a, b may be fabricated as part of a stand-alone memory circuit or as illustrated, may be fabricated between a first metal layer 104 and a second metal layer 106 that may be metal layers of the back-end-of-line (BEOL) network above a transistor layer in an integrated circuit (IC).

The first metal layer 104 may be formed of electrically conductive materials such as copper, tungsten, cobalt, ruthenium, aluminum, other metals, or conductive non-metals. The first metal layer 104 is insulated from other components by a lower interlayer dielectric (ILD) 122. The ILD 122 may include a non-crystalline solid material such as silicon dioxide ($SiO_2$) undoped silicate glass (USG), tetraethyl orthosilicate (TEOS), low-K dielectric, or ultra low-K dielectric materials, fluorosilicate glass (FSG), borophosphosilicate glass (BPSG), a spin-on low-K dielectric layer, a chemical vapor deposition (CVD) low-K dielectric layer or any combination thereof. The term "low-K" as used in the present application denotes a dielectric material that has a dielectric constant of less than silicon dioxide. In another embodiment, a self-planarizing material such as a spin-on glass (SOG) or a spin-on low-K dielectric material such as SiLK™ can be used as ILD 122. The use of a self-planarizing dielectric material as ILD 122 may avoid the need to perform a subsequent planarizing step. The second metal level 106 may include metalized trenches that are also formed of electrically conductive materials such as copper, tungsten, cobalt, ruthenium, aluminum, other metals, or conductive non-metals.

The MRAM pillars 102a, b may include bodies 112a, b formed as described below, with a pillar diameter 114. The bodies 112a, b may be connected to a bottom electrode 116 and a top electrode 118. The bottom electrode 116 may have the same diameter as the pillar diameter 114, but the top electrode 118 may have a top diameter 120 that is less than the pillar diameter 114. The top diameter 120 of the top electrode 118 enables the formation of ILD 110 between the MRAM pillars 102a, b that is uniformly deposited without voids forming between the first top electrode 118a and the second top electrode 118b. The formation of the MRAM pillars 102a, b will be described in detail in the following figures, with explanation for the benefit of reducing the formation of voids in the ILD 110.

Figure 2:
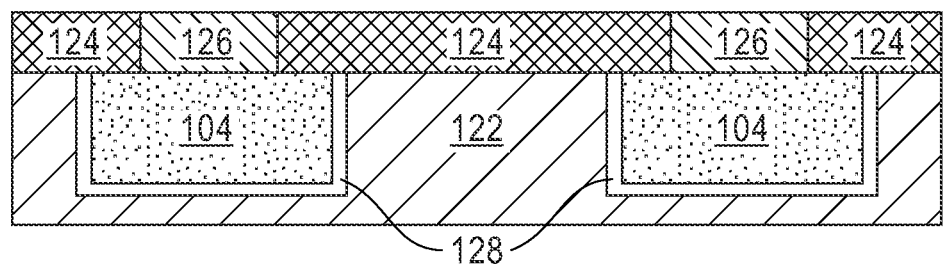
FIG. 2 depicts a cross-sectional side view of the semiconductor structure of FIG. 1 at an earlier stage of fabrication, in accordance with an embodiment of the invention.

FIG. 2 depicts a schematic cross-sectional diagram of the semiconductor structure 100, in accordance with one embodiment of the present invention. The semiconductor structure 100 includes the first metal layer 104 which (as previously mentioned) may be formed as one of the metal layers above a transistor layer (not illustrated) in a BEOL network of an IC. The first metal layer 104 may be formed in the lower ILD 122 with a dielectric cap 124 formed over the lower ILD 122 after the formation of the first metal layer 104. The dielectric cap 124 may include SiN, SiCN, SiCN (H), or other silicon compounds for insulating. A metal cap 126 may be formed through the dielectric cap 124 using a damascene process. The metal cap 126 and the dielectric cap 124 may be planarized using a chemical-mechanical planarization (CMP) process to make sure that the top surface of the dielectric cap 124 is flat. Certain embodiments of the first metal layer 104 may include a liner 128 to keep the first metal layer 104 from diffusing into the lower ILD 122.

Figure 3:
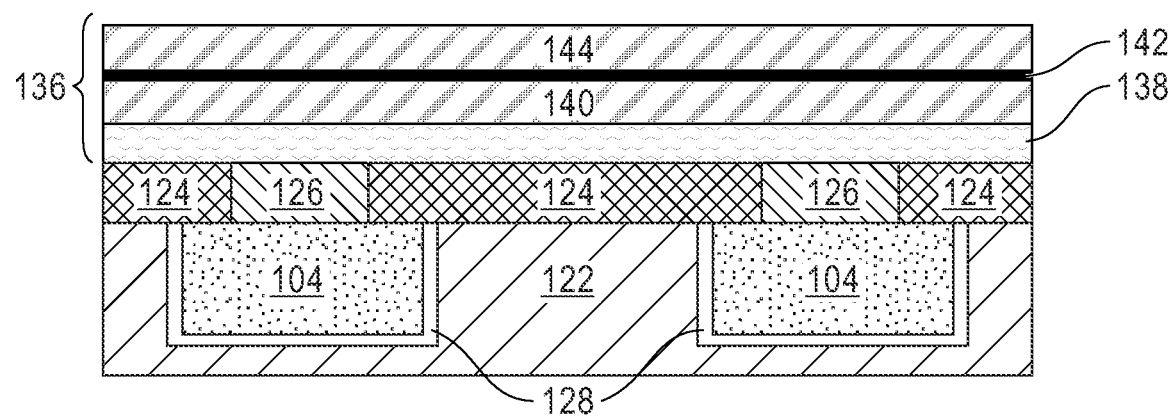
FIG. 3 depicts a cross-sectional side view of the semiconductor structure of FIG. 1 at a stage of fabrication, in accordance with an embodiment of the invention.

FIG. 3 depicts a schematic cross-sectional diagram of the semiconductor structure 100, in accordance with one embodiment of the present invention. Above the dielectric cap 124, the semiconductor structure 100 includes blanket layers 136 of MRAM material. The blanket layers 136 may be fabricated using known deposition processes such as chemical vapor deposition (CVD), atomic layer deposition (ALD), and/or physical vapor deposition (PVD). The blanket layers 136 may include, a bottom MRAM electrode layer 138 formed from Nb, NbN, W, WN, Ta, TaN, Ti, TiN, Ru, Mo, Cr, V, Pd, Pt, Rh, Sc, and other high melting point metals or conductive metal nitrides. The blanket layers 136 may also include a reference layer 140, a tunnel barrier 142, and a free layer 144. The reference layer 140 may be made of a ferromagnetic material and include materials such as NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. The ferromagnetic material enables a permanent magnetic field to be maintained in a fixed orientation. For example, the magnetic field may be fixed in a down orientation. The tunnel barrier 142 may be made of magnesium oxide, magnesium aluminum oxide, aluminum oxide, combinations of these, or other dielectric materials. The free layer 144 may be made of a magnetic material that enables the magnetic orientation to switch depending on a signal passed vertically through the finished MRAM pillars 102*a, b*. In general, the free layer 144 includes a ferromagnetic layer capable of a change in magnetization state. In some embodiments, the free layer 144 is a composite free layer that includes multiple ferromagnetic and coupling sub-layers.

Figure 4:
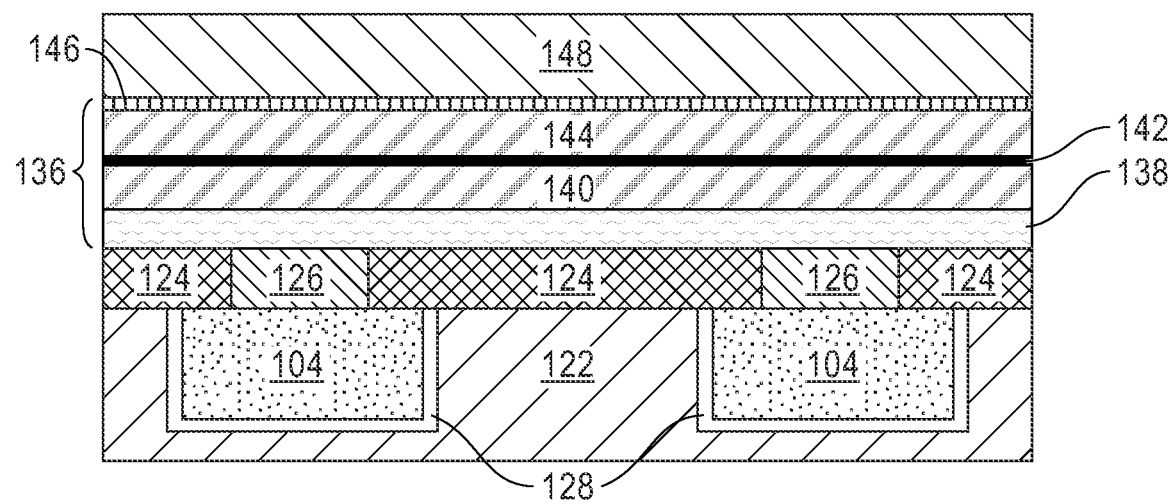
FIG. 4 depicts a cross-sectional side view of the semiconductor structure of FIG. 1 at a stage of fabrication, in accordance with an embodiment of the invention.

FIG. 4 depicts a schematic cross-sectional diagram of the semiconductor structure 100, in accordance with one embodiment of the present invention. The semiconductor structure 100 includes a top electrode metal sealing layer 146 and a top electrode dielectric layer 148. The top electrode metal sealing layer 146 seals and protects the free layer 144 from subsequent deposition and etch processes in the formation of the MRAM pillars 102*a, b*. The top electrode metal sealing layer 146 is typically formed from conductive material that is not as readily etched as the free layer. This sturdiness of the top electrode metal sealing layer 146 enables a broader possibility for materials in the free layer 144, since the free layer 144 will not be exposed to chemical or physical etch processes that pattern and etch the top electrode dielectric layer 148.

Figure 5:
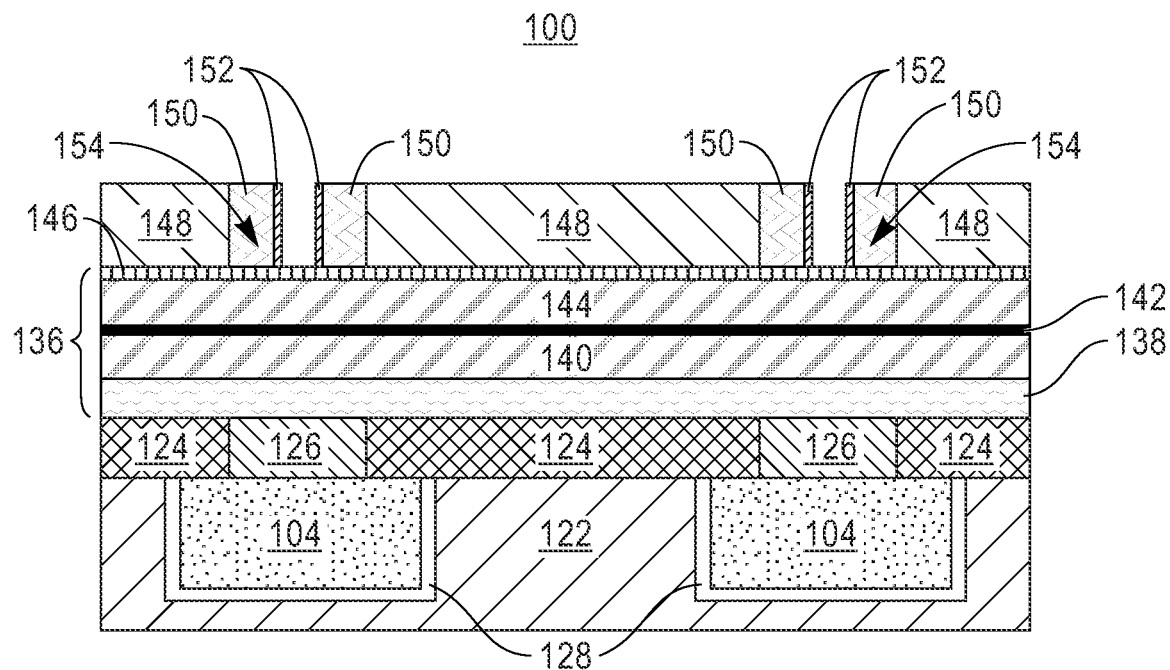
FIG. 5 depicts a cross-sectional side view of the semiconductor structure of FIG. 1 at a stage of fabrication, in accordance with an embodiment of the invention.

FIG. 5 depicts a schematic cross-sectional diagram of the semiconductor structure 100, in accordance with one embodiment of the present invention. The semiconductor structure 100 includes a conformal dielectric 150 and a top electrode nucleation layer 152. The conformal dielectric 150 may be formed in a via hole 154 that is patterned and etched using a masking material (not shown) that may be applied to the top of the semiconductor structure 100 (i.e., to the top of the top electrode dielectric layer 148), prior to etching. The masking material resists etching and can be utilized to form the desired shape and diameter of the bodies 112*a, b* of the MRAM pillars 102*a, b*. In some embodiments, the masking material may be a photoresist which has been patterned using photolithography on top of an organic planarizing material (OPL) and an inorganic hardmask (SiOx, SiN, SiC etc.). A photoresist pattern is transferred to the hardmask using an anisotropic etch such as reactive ion etching (RIE). This pattern is then used as mask for formation of the via hole 154.

The via hole 154 is formed with a size corresponding to the desired pillar diameter 114, and the conformal dielectric 150 is then formed as a conformal blanket layer covering all exposed surfaces. The conformal dielectric 150 is then etched back on the horizontal surfaces (e.g., using a directional etch process) to the level of the top surface of the top electrode metal sealing layer 146 and the bottom surface of the top electrode dielectric layer 148. The remaining vertical portion of the conformal dielectric 150 in the via hole 154 represents the majority of the difference between the pillar diameter 114 and the top diameter 120. The top electrode nucleation layer 152 is also formed as a conformal blanket layer, with subsequent horizontal portions being etched back. The nucleation layer 152 makes sure that the top electrode 118 deposits evenly within the via hole 154 and does not clump unevenly onto the conformal dielectric 150.

Figure 6:
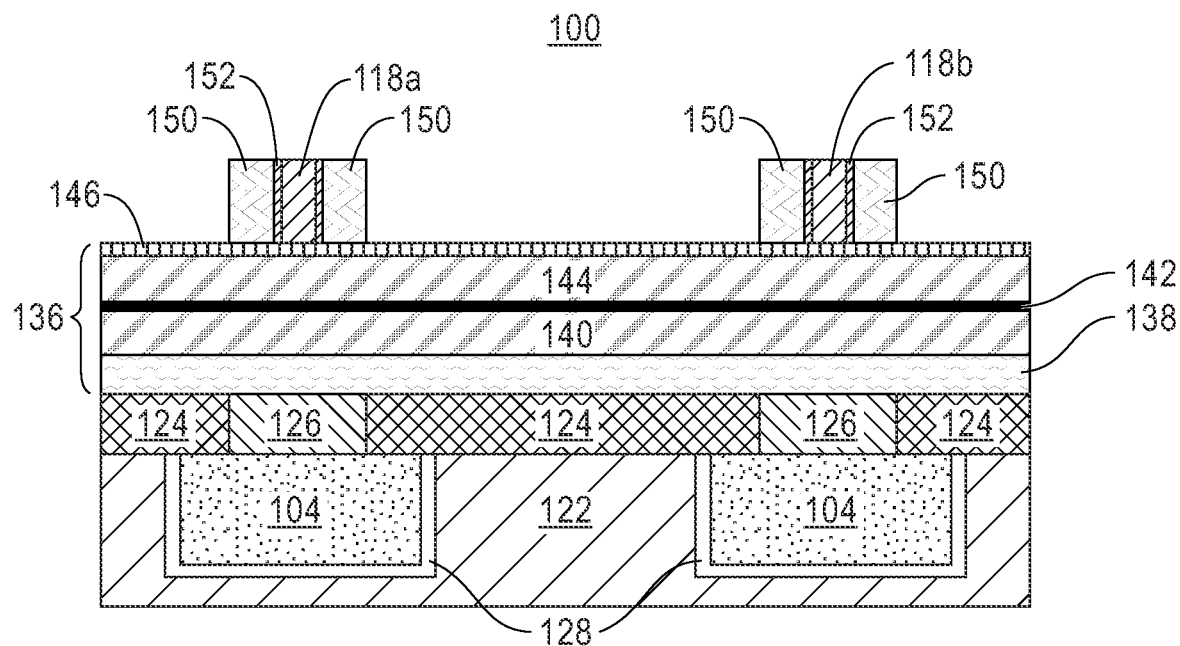
FIG. 6 depicts a cross-sectional side view of the semiconductor structure of FIG. 1 at a stage of fabrication, in accordance with an embodiment of the invention.

FIG. 6 depicts a schematic cross-sectional diagram of the semiconductor structure 100, in accordance with one embodiment of the present invention. The semiconductor structure 100 includes the top electrodes 118*a, b*. The top electrodes 118*a, b* are formed by uniformly building up the conductive material (e.g., Nb, NbN, W, WN, Ta, TaN, Ti, TiN, Ru, Mo, Cr, V, Pd, Pt, Rh, Sc, and other high melting point metals or conductive metal nitrides) and subsequently removing the material from above the top electrode dielectric layer 148. Removing the material may be done using etch or planarization techniques. After the top electrodes 118*a, b* are formed and etched, the top electrode dielectric layer 148 is also removed using a selective etch process that does not remove the conformal dielectric 150, the top electrode nucleation layer 152, the top electrode metal sealing layer 146 or the top electrodes 118*a, b*.

Figure 7:
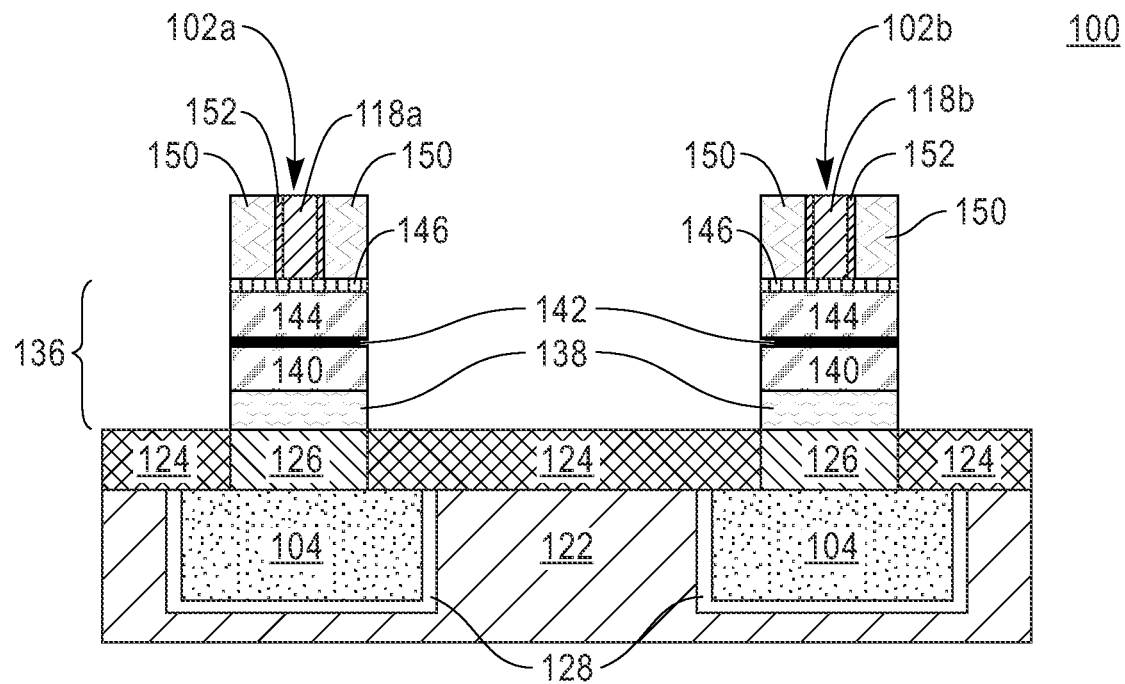
FIG. 7 depicts a cross-sectional side view of the semiconductor structure of FIG. 1 at a stage of fabrication, in accordance with an embodiment of the invention.

FIG. 7 depicts a schematic cross-sectional diagram of the semiconductor structure 100, in accordance with one embodiment of the present invention. The semiconductor structure 100 includes the blanket layers 136 etched into the first MRAM pillar 102*a* and the second MRAM pillar 102*b*. The top electrodes 118*a, b*, with the conformal dielectric 150 and the top electrode nucleation layer 152 form the mask of the MRAM pillars 102*a, b* so that the top electrodes 102*a, b* are coaxial and self-aligned to the MRAM pillars 102*a, b*. The term "coaxial" as used herein for the top electrodes 118*a, b* means that the center of the top electrodes 118*a, b* and the center of the bodies 112*a, b* of the MRAM pillars 102*a, b* are colinear. The coaxial arrangement of the top electrodes 118*a, b* is assured by the fact that the conformal dielectric 150 is uniformly formed within the top electrode dielectric layer 148, and forms the basis for the outer boundary of the pillar diameter 114 (i.e., the outer boundary of the conformal dielectric 150) and the top diameter 120.

The etch process or processes for etching the blanket layers 136 may be selected from directional etch processes that do not affect the dielectric cap 124.

Figure 8:
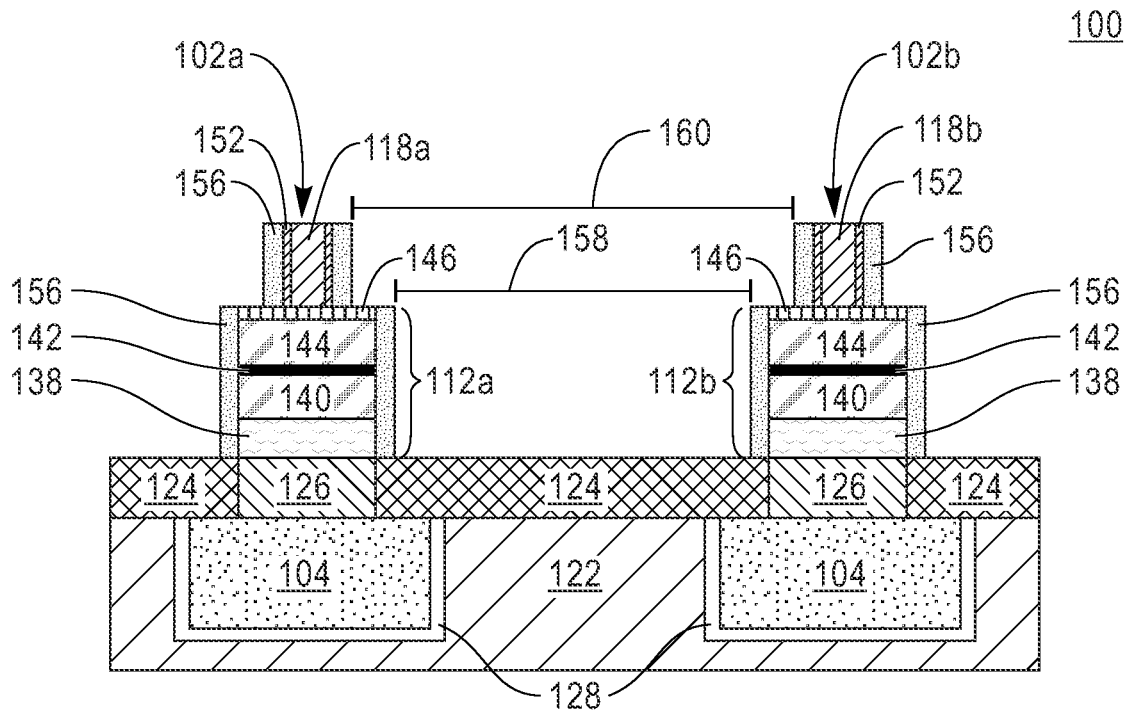
FIG. 8 depicts a cross-sectional side view of the semiconductor structure of FIG. 1 at a stage of fabrication, in accordance with an embodiment of the invention.

FIG. 8 depicts a schematic cross-sectional diagram of the semiconductor structure 100, in accordance with one embodiment of the present invention. The semiconductor structure 100 includes an encapsulation layer 156 that has been etched back on the horizontal surfaces so that only the vertical portions of the encapsulation layer 156 remain. The encapsulation layer 156 may be formed after the conformal dielectric 150 is selectively removed. Removing the conformal dielectric 150 from surrounding the top electrode 118 reduces the diameter of the MRAM pillars 102*a, b* for the portion above the body 112a, b. In other words, a body distance 158 between the first MRAM body 112a and the second MRAM body 112b is less than a top distance 160 between the first top electrode 118a and the second top electrode 118b.

Certain embodiments may remove the conformal dielectric 150 without subsequently adding the encapsulation layer 156. Other embodiments, however, may benefit from the encapsulation layer 156 as a protection for the MRAM pillars 102a, b from later fabrication processes. Furthermore, the encapsulation layer 156 may also prevent diffusion of the MRAM pillars 102a, b into the ILD 110.

Figure 9:
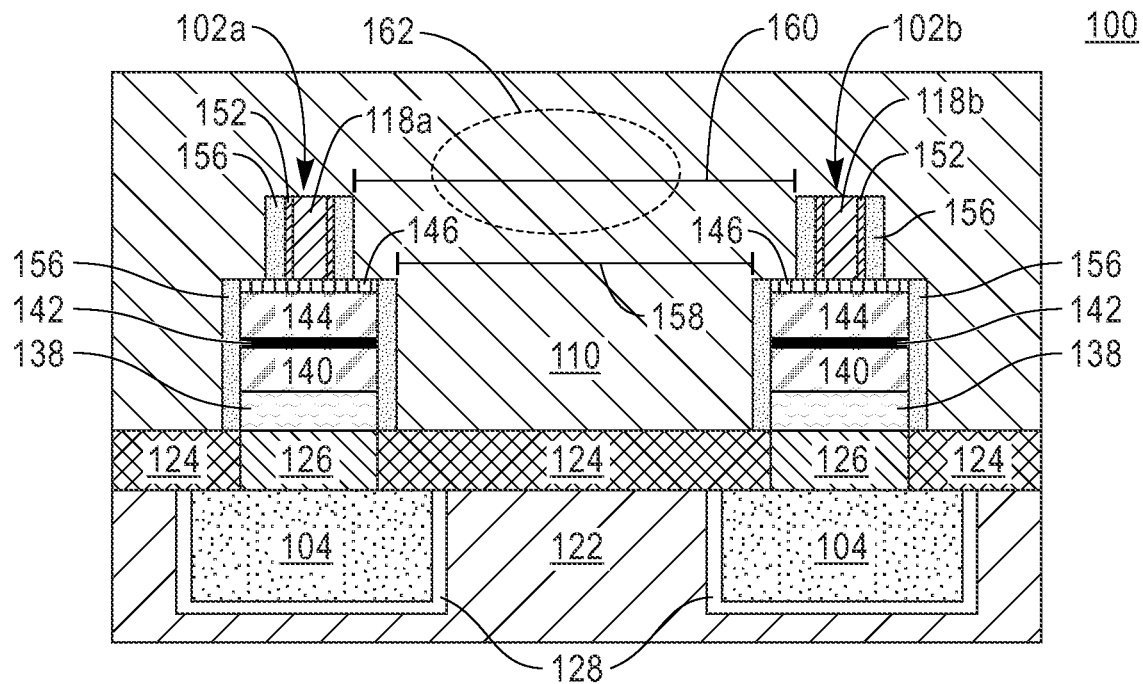
FIG. 9 depicts a cross-sectional side view of the semiconductor structure of FIG. 1 at a stage of fabrication, in accordance with an embodiment of the invention.

FIG. 9 depicts a schematic cross-sectional diagram of the semiconductor structure 100, in accordance with one embodiment of the present invention. The semiconductor structure 100 includes the ILD 110 formed on the dielectric cap 124, and around the MRAM pillars 102a, b. As mentioned above, the ILD 110 may include a non-crystalline solid material such as silicon dioxide ($SiO_2$) undoped silicate glass (USG), tetraethyl orthosilicate (TEOS), low-K dielectric, or ultra low-κ dielectric materials, fluorosilicate glass (FSG), borophosphosilicate glass (BPSG), a spin-on low-κ dielectric layer, a chemical vapor deposition (CVD) low-κ dielectric layer or any combination thereof. Since many of these materials have been developed for deposition on flat/featureless surfaces, the ILD 110 does not conform to the MRAM pillars 102a, b. The larger top distance 160, therefore, increases the likelihood of uniform deposition of the ILD 110, particularly in a shorting area 162 between the first top electrode 118a and the second top electrode 118b. That is, as the ILD 110 is deposited between the first MRAM pillar 102a and the second MRAM pillar 102b, the ILD 110 will build up from the dielectric cap 124 into the shorting area 162 before the ILD 110 builds over from the first top electrode 118a or the second top electrode 118b. The presence of the ILD 110 in the shorting area 162 prevents metal forming in the shorting area 162 during formation of the second metal layer 106.

Figure 10:
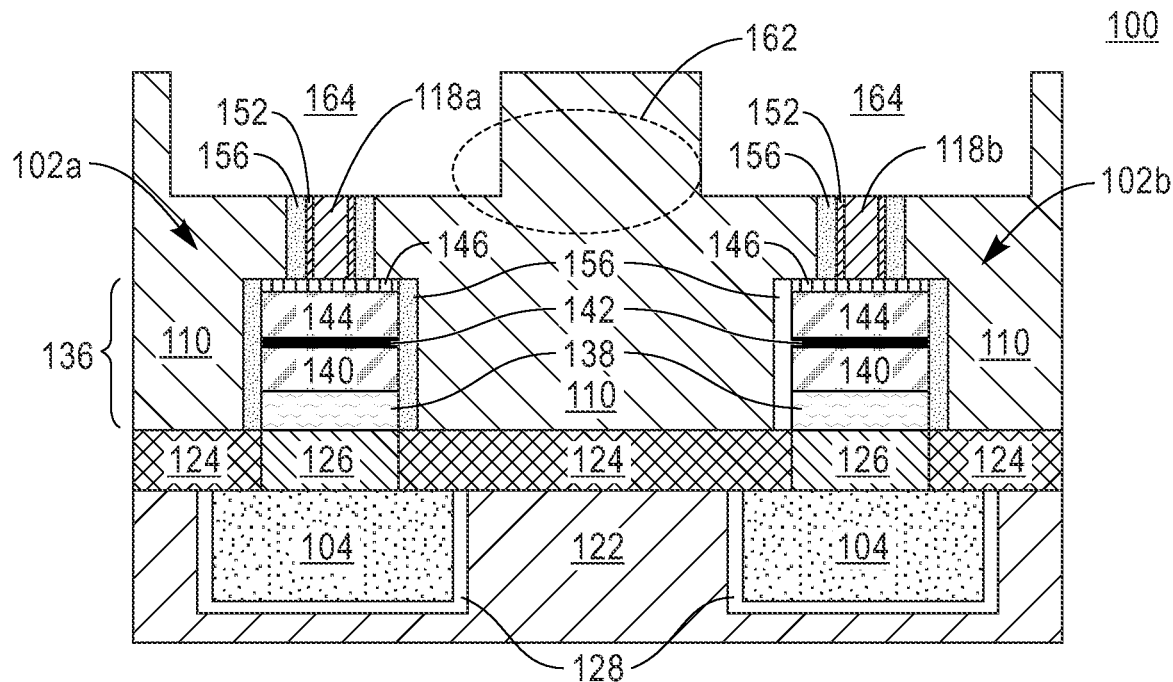
FIG. 10 depicts a cross-sectional side view of the semiconductor structure of FIG. 1 at a stage of fabrication, in accordance with an embodiment of the invention.

FIG. 10 depicts a schematic cross-sectional diagram of the semiconductor structure 100, in accordance with one embodiment of the present invention. The semiconductor structure 100 includes contact trenches 164 patterned into the ILD 110. As illustrated, the contact trenches 164 may be larger than the MRAM pillars 102a, b, such that any voids in the shorting area 162 may be opened up when the contact trenches 164 are patterned and cut into the ILD 110. If the ILD 110 has voids that are opened up, then the voids will be metalized with the contact trenches 164, causing a short between the first MRAM pillar 102a and the second MRAM pillar 102b. Metalized contact trenches 164 are shown in FIG. 1 as the second metal layer 106.

Figure 11:
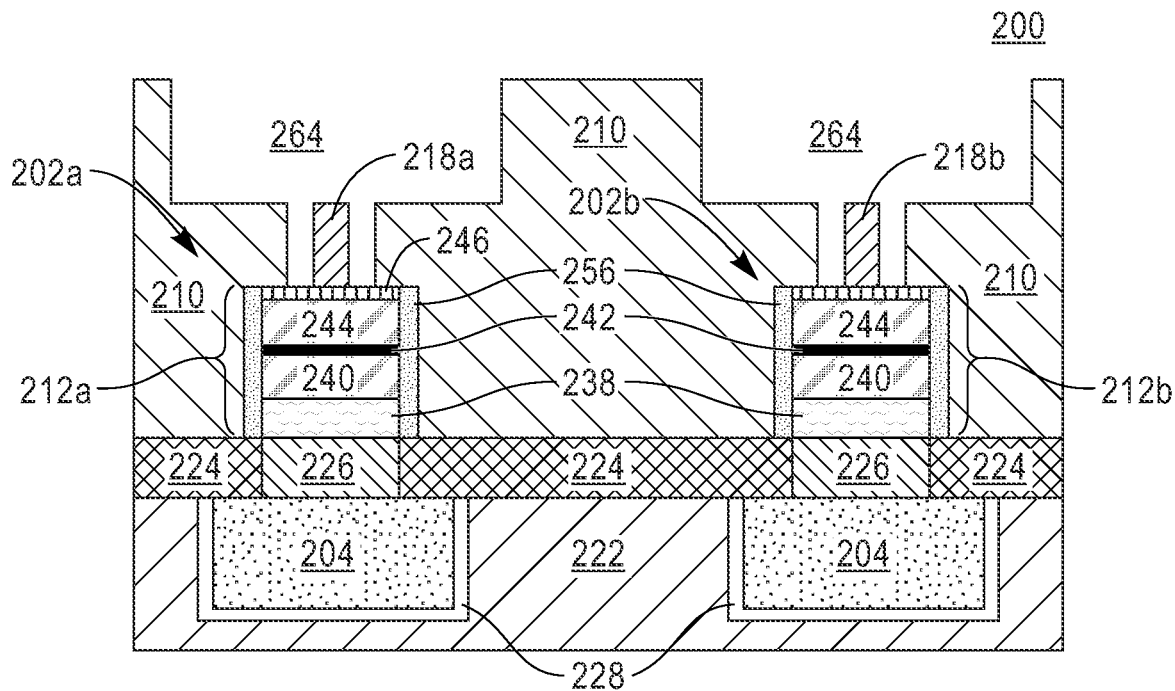
FIG. 11 depicts a cross-sectional side view of a semiconductor structure at a stage of fabrication, in accordance with an embodiment of the invention.

FIG. 11 depicts a schematic cross-sectional diagram of a semiconductor structure 200, in accordance with one embodiment of the present invention. The semiconductor structure 200 may include a first MRAM pillar 202a, a second MRAM pillar 202b, and an ILD 210 in between that are formed in the same or similar manner as the semiconductor structure 100 described above. Rather than metalizing contact trenches 264 directly after patterning (i.e., as in the semiconductor structure 100 disclosed in FIG. 1), however, the semiconductor structure 200 of FIG. 11 includes removal of an encapsulation layer and a top electrode nucleation layer around top electrodes 218a, b. The encapsulation layer and the top electrode nucleation layer may be removed using etch processes that do not affect the top electrodes 218a, b or the ILD 210.

Figure 12:
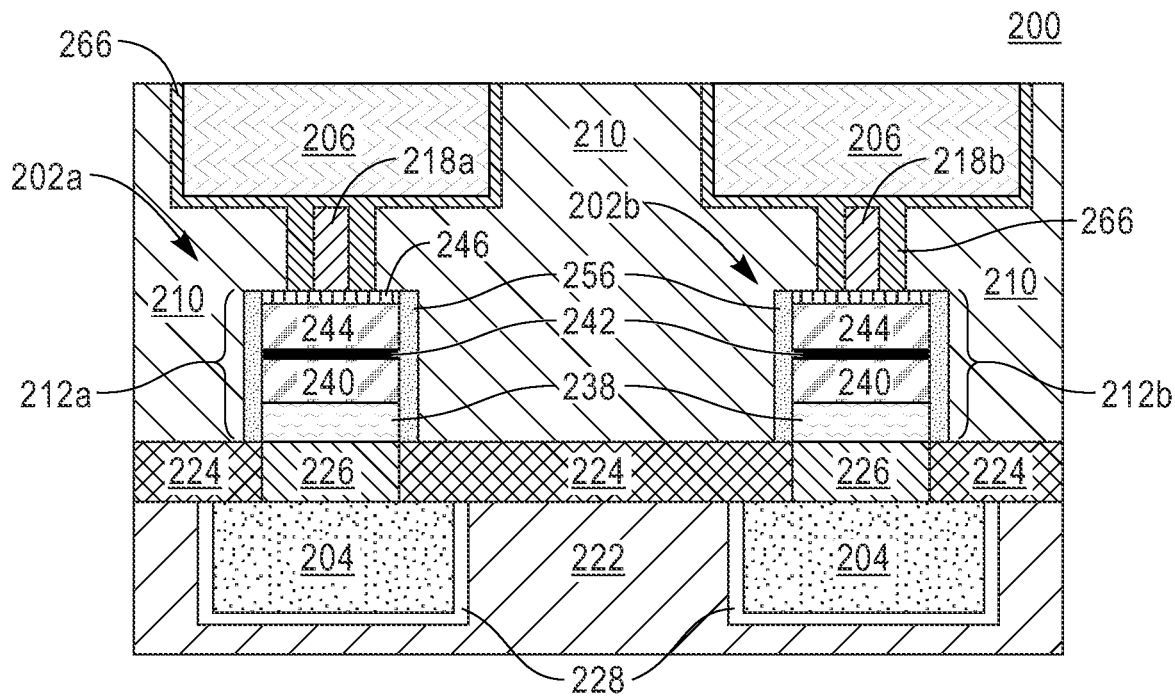
FIG. 12 depicts a cross-sectional side view of the semiconductor structure of FIG. 11 at a stage of fabrication, in accordance with an embodiment of the invention.

FIG. 12 depicts a schematic cross-sectional diagram of the semiconductor structure 200 of FIG. 11, in accordance with one embodiment of the present invention. The semiconductor structure 200 includes a second metal layer 206 formed within the contact trenches 264. The second metal layer 206 may also include a metal barrier shell 266 that is formed first within the contact trenches 264 and in the space that had been taken up by the top electrode nucleation layer and the encapsulation layer. The metal barrier shell 266 is formed of conductive material such as high melting point metals or conductive metal nitrides, and may increase the contact surface area of the top electrodes 218a, b. The increased contact surface area may thus increase signal flow between the second metal layer 206 and bodies 212a, b of the MRAM pillars 202a, b, which may produce a decrease in the resistance of the signal passing through the top electrodes 218a, b.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure, comprising:
 a first magneto-resistive random access memory (MRAM) pillar, comprising:
  a bottom electrode layer;
  a reference layer connected above the bottom electrode layer;
  a free layer; and
  a tunnel barrier between the reference layer and the free layer, wherein the MRAM pillar comprises a pillar diameter; and a coaxial top electrode comprising a top diameter that is less than the pillar diameter wherein the coaxial top electrode comprises an inner conductor core and an outer metal barrier shell.

2. The semiconductor structure of claim 1, further comprising:
a second MRAM pillar adjacent to the first MRAM pillar; and
an inter-level dielectric (ILD) between the first MRAM pillar and the second MRAM pillar.

3. The semiconductor structure of claim 1, further comprising a bottom metal wire directly connected to the bottom electrode layer, wherein the bottom metal wire comprises a first metal level of a back-end-of-line (BEOL) network.

4. The semiconductor structure of claim 3, further comprising a top metal wire directly connected to the coaxial top electrode, wherein the top metal wire comprises a second metal level of the BEOL network.

5. The semiconductor structure of claim 4, wherein the outer metal barrier shell comprises a metal material that is the same as at least a portion of the top metal wire.

6. The semiconductor structure of claim 1, wherein the coaxial top electrode comprises an inner conductor core and an outer nucleation layer shell.

7. The semiconductor structure of claim 1, further comprising a metal sealing layer between the free layer and the coaxial top electrode.

8. A method of fabricating a magneto-resistive random access memory (MRAM) device, comprising:
forming a bottom electrode layer, a reference layer connected above the bottom electrode layer, a free layer, and a tunnel barrier between the reference layer and the free layer;
forming a first coaxial top electrode surrounded by a first conformal dielectric, wherein the coaxial top electrode comprises a top diameter and the conformal dielectric comprises a pillar diameter;
etching the bottom electrode layer, the reference layer, the free layer, and the tunnel barrier to form an MRAM pillar, wherein the first conformal dielectric masks the bottom electrode layer, the reference layer, the free layer, and the tunnel barrier;
removing the conformal dielectric; and
forming an inter-level dielectric (ILD) around the MRAM pillar and the top electrode.

9. The method of claim 8, comprising:
forming a second MRAM pillar by etching the bottom electrode layer, the reference layer, the free layer, and the tunnel barrier below a second top electrode surrounded by a second conformal dielectric.

10. The method of claim 8, further comprising forming a bottom metal wire directly connected to the bottom electrode layer, wherein the bottom metal wire comprises a first metal level of a back-end-of-line (BEOL) network.

11. The method of claim 10, further comprising forming a top metal wire directly connected to the coaxial top electrode, wherein the top metal wire comprises a second metal level of the BEOL network.

12. The method of claim 11, further comprising forming an outer metal barrier shell around the first top electrode, wherein the outer metal barrier shell comprises a metal material that is the same as at least a portion of the top metal wire.

13. The method of claim 8, further comprising forming an outer nucleation layer shell around an inner conductor core of the first coaxial top electrode.

14. The method of claim 13, further comprising forming a metal sealing layer between the free layer and the first coaxial top electrode.

15. The method of claim 8, wherein forming the ILD comprises a selection from the group consisting of: spin-on deposition, chemical-vapor deposition (CVD), and plasma-enhanced chemical vapor deposition (PECVD).

16. A semiconductor structure, comprising:
a first magneto-resistive random access memory (MRAM) pillar comprising:
a first body comprising a first pillar diameter; and
a first coaxial top electrode comprising a first top diameter that is smaller than the first pillar diameter, wherein the first coaxial top electrode comprises an inner conductor core and an outer metal barrier shell;
a second MRAM pillar adjacent to the first MRAM pillar comprising:
a second body comprising a second pillar diameter; and
a second coaxial top electrode comprising a second top diameter that is smaller than the second pillar diameter; and
an inter-level dielectric (ILD) between the first MRAM pillar and the second MRAM pillar.

17. The semiconductor structure of claim 16, wherein a top distance between the first coaxial top electrode and the second coaxial top electrode is greater than a body distance between the first body and the second body.

18. The semiconductor structure of claim 16, further comprising a bottom metal wire directly connected to the first body, wherein the bottom metal wire comprises a first metal level of a back-end-of-line (BEOL) network.

19. The semiconductor structure of claim 18, further comprising a metal sealing layer between the first body and the first coaxial top electrode.

20. The semiconductor structure of claim 18, wherein the first coaxial top electrode comprises an outer nucleation layer shell.

* * * * *